US010950587B2

(12) United States Patent
Jeon et al.

(10) Patent No.: US 10,950,587 B2
(45) Date of Patent: Mar. 16, 2021

(54) PRINTED CIRCUIT BOARD AND PACKAGE STRUCTURE

(71) Applicant: Samsung Electro-Mechanics Co., Ltd., Suwon-si (KR)

(72) Inventors: Kee-Su Jeon, Suwon-si (KR); Min-Jae Seong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/662,080

(22) Filed: Oct. 24, 2019

(65) Prior Publication Data

US 2020/0144234 A1    May 7, 2020

(30) Foreign Application Priority Data

Nov. 5, 2018  (KR) .......................... 10-2018-0134273

(51) Int. Cl.
| | | |
|---|---|---|
| *H01L 29/40* | (2006.01) | |
| *H01L 21/4763* | (2006.01) | |
| *H01L 25/10* | (2006.01) | |
| *H01L 23/498* | (2006.01) | |
| *H05K 1/11* | (2006.01) | |
| *H05K 3/28* | (2006.01) | |
| *H01L 23/00* | (2006.01) | |

(52) U.S. Cl.
CPC ...... *H01L 25/105* (2013.01); *H01L 23/49822* (2013.01); *H01L 23/49827* (2013.01); *H01L 23/49838* (2013.01); *H01L 24/16* (2013.01); *H05K 1/113* (2013.01); *H05K 3/28* (2013.01); *H01L 2224/16227* (2013.01); *H01L 2225/1058* (2013.01)

(58) Field of Classification Search
CPC ........ H01L 21/76804; H01L 21/76831; H05K 2201/09827
USPC ........................... 438/638–640; 257/773–775
See application file for complete search history.

(56) References Cited

U.S. PATENT DOCUMENTS

| | | | | |
|---|---|---|---|---|
| 4,560,436 A | * | 12/1985 | Bukhman | ......... H01L 21/76804 204/192.32 |
| 7,494,916 B2 | * | 2/2009 | Hsu | .................... H01L 21/76814 438/622 |
| 8,980,691 B2 | * | 3/2015 | Lin | ..................... H01L 23/5389 438/107 |
| 9,171,778 B2 | * | 10/2015 | Coolbaugh | ....... H01L 21/76832 |
| 2004/0152336 A1 | * | 8/2004 | Miura | ............... H01L 21/76829 438/761 |

FOREIGN PATENT DOCUMENTS

| | | |
|---|---|---|
| JP | 5032205 B2 | 9/2012 |
| KR | 10-1143042 B1 | 5/2012 |
| KR | 10-2012-0137173 A | 12/2012 |
| WO | 2010/113448 A1 | 10/2010 |

* cited by examiner

*Primary Examiner* — Calvin Lee
(74) *Attorney, Agent, or Firm* — NSIP Law

(57) ABSTRACT

A printed circuit board includes an insulating material with a bump pad buried in one surface, an adhesive layer stacked on the one surface of the insulating material, an insulating layer stacked on the adhesive layer, and a cavity passing through both of the adhesive layer and the insulating layer to expose the bump pad, wherein the cavity has a cross-sectional area decreasing in a direction toward the insulating material.

22 Claims, 7 Drawing Sheets

PRINTED CIRCUIT BOARD AND PACKAGE STRUCTURE

CROSS-REFERENCE TO RELATED APPLICATIONS

This application claims the benefit under 35 U.S.C. 119(a) of Korean Patent Application No. 10-2018-0134273 filed on Nov. 5, 2018, in the Korean Intellectual Property Office, the entire disclosure of which is incorporated herein by reference for all purposes.

BACKGROUND

1. Field

The present disclosure relates to a printed circuit board and a package structure.

2. Discussion of the Background

In a package-on-package (POP) structure in which two packages are vertically stacked, when a circuit of a lower package is miniaturized, the pitch of solder balls connecting two packages decreases and also the height of the solder balls decreases. When the height of the solder balls is decreased, the thickness of an electronic element mounted on the lower package cannot be increased beyond a certain level.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating material with a bump pad buried in one surface, an adhesive layer stacked on the one surface of the insulating material, an insulating layer stacked on the adhesive layer, and a cavity passing through both of the adhesive layer and the insulating layer to expose the bump pad, wherein the cavity has a cross-sectional area decreasing in a direction toward the insulating material.

The cavity may have an inner side surface including a concave curved surface.

The cavity includes a first region passing through the insulating layer and a second region passing through the adhesive layer, and the inner side surface of the first region may be steeper than the inner side surface of the second region.

The insulating layer may have a greater thickness than the adhesive layer.

The printed circuit board may further include a via passing through both of the insulating layer and the adhesive layer.

The printed circuit board may further include a via pad buried in the one surface of the insulating material, wherein the via may be connected to the via pad.

The printed circuit board may further include an inner via disposed inside the insulating material connected to the via pad, wherein the via may have a cross-sectional area decreasing in a direction toward the via pad, and wherein the inner via may have a cross-sectional area decreasing in a direction toward the via pad.

The printed circuit board may further include a second adhesive layer disposed on the insulating layer.

The printed circuit board may further include a solder resist disposed on a bottom surface of the cavity to expose the bump pad.

The printed circuit board may further include a protective layer disposed on the one surface of the insulating material along a circumference of the cavity.

The protective layer may have an edge covered by the adhesive layer.

In another general aspect, a package structure in which an upper package and a lower package are bonded, the lower package includes a printed circuit board with an electronic element mounted thereon, wherein the printed circuit board includes an insulating material with a bump pad buried in one surface, an adhesive layer stacked on the one surface of the insulating material, an insulating layer stacked on the adhesive layer, and a cavity passing through both of the adhesive layer and the insulating layer to expose the bump pad, wherein the cavity has a cross-sectional area decreasing in a direction toward the insulating material, and wherein the electronic element is located inside the cavity and bonded to the bump pad.

The via may be electrically connected to the upper package.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
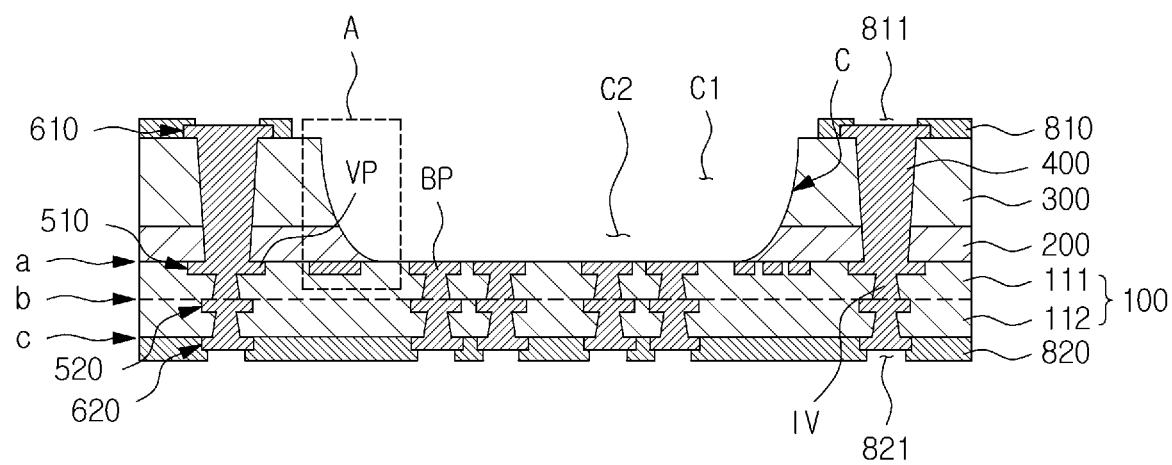
FIG. 1A is a diagram showing a printed circuit board according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

FIG. 1A is a diagram showing a printed circuit board (PCB) according to one or more examples.

Referring to FIG. 1A, the PCB according to one or more examples may include an insulating material 100, an adhesive layer 200, an insulating layer 300, and a cavity C.

The insulating material 100 may have a plate-like structure formed of a nonconductive material. The insulating material 100 may be formed of a material containing a resin, and the resin contained in the insulating material 100 may be variously selected from among thermosetting resins, thermoplastic resins, and the like. For example, as the resin of the insulating material 100, an epoxy resin, a polyimide (PI) resin, a bismaleimide-triazine (BT) resin, a liquid crystal polymer (LCP), or the like may be selected, but the present disclosure is not limited thereto. For example, the insulating material 100 includes a prepreg (PPG) and an Ajinomoto build-up film (ABF).

A fiber reinforcing material or a filler may be contained in the insulating material 100. The fiber reinforcing material may include glass cloth, and the glass cloth may be one or more of a glass filament, a glass fiber, and a glass fabric which are classified according to their thickness. The prepreg may have a structure in which an epoxy resin is impregnated in glass cloth. Meanwhile, the filler may be an inorganic filler or an organic filler. As the inorganic filler, one or more selected from the group consisting of silica ($SiO_2$), alumina ($Al_2O_3$), silicon carbide (SiC), barium sulfate ($BaSO_4$), talc, mud, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$) may be used.

The insulating material may include an inner layer circuit therein. The inner layer circuit provides a path for transferring electrical signals and may be formed of one or more of copper (Cu), silver (Ag), palladium (Pd), aluminum (Al), nickel (Ni), titanium (Ti), gold (Au), and platinum (Pt). Also, an inner via IV connected to the inner layer circuit to provide an interlayer connection path may be formed inside the insulating material 100. The inner via IV may be formed of copper (Cu), silver (Ag), palladium (Pd), aluminum (Al), nickel (Ni), titanium (Ti), gold (Au), and platinum (Pt), and may be formed of the same metal as the inner layer circuit.

The inner layer circuit may be implemented in a structure in which a portion thereof is buried in one surface of the insulating material 100. As shown in FIG. 1A, one surface (a) of the insulating material 100 may be an upper surface of the insulating material 100. The fact that the inner layer circuit is buried in the one surface of the insulating material 100 means that a portion of the thickness of the inner layer circuit is located inside the insulating material 100. For example, the inner layer circuit is entirely located inside the insulating material 100 so that only the upper surface of the inner layer circuit may be exposed to the one surface of the insulating material 100 and may also be coplanar with the one surface of the insulating material 100.

The inner layer circuit may include a plurality of circuit lines, and one or more of the plurality of circuit lines may have a pad at their ends. The pad may have a larger width than the circuit line. The pad provided at an end of the circuit line may be a bump pad BP or a via pad VP. The bump pad BP is a pad connected to a solder bump, and the via pad VP is a pad to which the via 400 is connected. The via pad VP may be located closer to an edge of the insulating material 100 than the bump pad BP. That is, the bump pad BP may be located at a central portion of the insulating material 100. The bump pad BP may be provided with a plurality of bump pads, and also the via pad VP may be provided with a plurality of via pads.

The insulating material 100 may be composed of a plurality of layers. The plurality of layers may be formed of the same or different materials. For convenience of description, in FIG. 1A, the insulating material 100 is composed of two layers, i.e., a first layer 111 and a second layer 112. The first layer 111 may be a layer located at an upper side, and the second layer 112 may be a layer located at a lower side. Here, one surface of the first layer 111 and the one surface of the above-described insulating material 100 may be the same surface (a). Meanwhile, unlike FIG. 1A, the insulating material may have a structure of three or more layers, and there is no limitation on the number of layers of the insulating material 100.

Each of the layers 111 and 112 of the insulating material 100 may include an inner layer circuit. An inner layer circuit buried in the one surface of the first layer 111 may be a first inner layer circuit 510, and an inner layer circuit formed on the other surface of the first layer 111 and buried in one surface (b) of the second layer 112 may be a second inner layer circuit 520. Here, the other surface of the first layer 111 and the one surface of the second layer 112 are the same surface (b). The first inner layer circuit 510 and the second inner layer circuit 520 may be electrically connected to each other through an inner via IV. The inner via IV may be provided with a plurality of inner vias, and the plurality of inner vias IV may include an inner via for connecting the second inner layer circuit 520 and the bump pad BP and/or an inner via for connecting the second inner layer circuit 520 and the via pad VP.

When the insulating material 100 is formed in a structure of N layers (here N is greater than or equal to three), the insulating material 100 includes the first layer 111 to an N$^{th}$ layer and may include the first inner layer circuit 510 to an N$^{th}$ inner layer circuit.

The adhesive layer 200 may be stacked on the one surface of the insulating material 100, i.e., the one surface of the first layer 111, to cover the first inner layer circuit 510, for example, to cover the via pad VP. The adhesive layer 200 may have adhesiveness and may be a resin layer formed of a thermosetting resin. The adhesive layer 200 may be formed of one or more of an epoxy resin, an amino resin, a phenol resin, a urea resin, a melamine resin, an unsaturated polyester resin, and a polyurethane resin. Meanwhile, the adhesive layer 200 may have not only the thermosetting property but also the photo-curing property.

The insulating layer 300 may be stacked on the adhesive layer 200 and may be located on the opposite side from the insulating material 100 with respect to the adhesive layer 200. The insulating layer 300 may be formed of any one selected from among an epoxy resin, a PI resin, a BT resin, an LCP, and the like. For example, the insulating layer 300 may include a PPG and an ABF film. The insulating layer 300 may contain glass cloth, a filler, etc., which have been described above. The insulating layer 300 may be formed of the same material as or a different material from the insulating material 100. The insulating layer 300 may be adhered to the insulating material 100 by the adhesive layer 200.

The insulating layer 300 may have a greater thickness than the adhesive layer 200. The thickness of the insulating layer 300 may be greater than or equal to the total thickness of the insulating material 100 (the thickness of the first layer 111 and the thickness of the second layer 112). Also, the thickness of the adhesive layer 200 may be less than or equal to the thickness of one layer (the first layer 111 or the second layer 112) of the insulating material 100. The total thickness of the insulating layer 300 and the adhesive layer 200 may be greater than or equal to 50 μm. The cavity C may also have a depth of 50 μm or more because the total thickness of the insulating layer 300 and the adhesive layer 200 may determine the depth of the cavity C.

The cavity C may be formed in the adhesive layer 200 and the insulating layer 300, and the cavity C exposes the bump pad BP. That is, a portion capable of exposing the bump pad BP may be determined as the location of the cavity C. When the bump pads BP is provided with a plurality of bump pads BP, the cavity C may expose all of the plurality of bump pads BP. There may be a single cavity C, and the single cavity C may be formed at a location capable of exposing all of the plurality of bump pads BP. When the bump pad BP is located at a central portion of the insulating material 100, the cavity C may also be formed at the central portion of the insulating material 100. However, as shown in FIG. 1A, a part of the first inner layer circuit 510 other than the bump pad BP may be exposed by the cavity C.

The cavity C may pass through both of the adhesive layer 200 and the insulating layer 300. Passing through both of the adhesive layer 200 and the insulating layer 300 means that the adhesive layer 200 and the insulating layer 300 are removed at one time in the process of forming the cavity C and that the inner side surface of the cavity C structurally has a surface that is smoothly continuous at a boundary between the adhesive layer 200 and the insulating layer 300 with no bending. That is, in a longitudinal section of the cavity C, the inner side surface of the cavity C is shown as a linear shape (hereinafter, referred to as a sectional line of the cavity C). At the boundary between the adhesive layer 200 and the insulating layer 300, the adhesive layer 200 has the same slope (or curvature) as the insulating layer 300.

The cavity C has a cross-sectional area decreasing in a direction toward the insulating material 100 (downward). FIGS. 1B to 1E are enlarged views of region A of FIG. 1A. Various shapes of the cavity C will be described below with reference to FIGS. 1B to 1E.

Figure 1B:
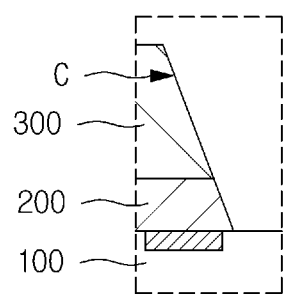
FIGS. 1B to 1E are enlarged views of region A of FIG. 1A.

For example, as shown in FIG. 1B, the cross-sectional area of the cavity C may decrease at a constant rate in a downward direction. In this case, the sectional line of the cavity C is shown as a downward straight line. The sectional line of the cavity C in the adhesive layer and the sectional line of the cavity C in the insulating layer 300 are collinear.

Meanwhile, the inner side surface of the cavity C may include a concave curved surface. Here, the concave curved surface means a curved surface that is recessed into the adhesive layer 200 and the insulating layer 300, and the sectional line of the cavity C appearing on the longitudinal section of the cavity C may include a downward curved line. Such a concave curved surface may appear in a portion or the entirety of the inner side surface of the cavity C. In FIG. 1A, the concave curved surface is shown as appearing in the entirety of the inner side surface of the cavity C.

Figure 1C:
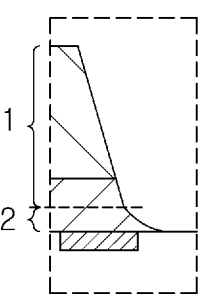
Figure 1D:
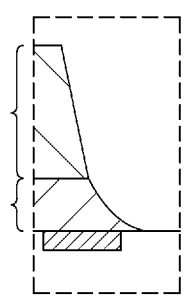
Figure 1E:
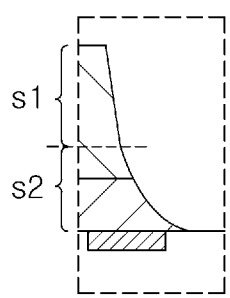

In FIGS. 1C to 1E, a concave curved surface s2 is shown as appearing in a portion of the inner side surface of the cavity C. A portion other than the concave curved surface may be a planar inclined surface s1 (i.e., a region where the cross-sectional area of the cavity C decreases at a constant rate). Here, the inner side surface of the cavity C is shown as a curved line in the concave curved surface s2 and is shown as a straight line in the planar inclined line s1. However, the planar inclined surface s1 and the concave curved surface s2 have substantially the same instantaneous slope in a portion where the planar inclined surface s1 and the concave curved surface s2 meet, and thus the two surfaces are smoothly connected to each other without bending.

Referring to FIG. 1C, the planar inclined surface s1 is formed in a partial region of the adhesive layer 200 and the entirety of the insulating layer 300. The concave curved surface s2 appears in the remaining region of the adhesive layer 200.

Referring to FIG. 1D, the planar inclined surface s1 is formed in only the insulating layer 300, and the concave curved surface s2 is formed in only the adhesive layer 200.

Referring to FIG. 1E, the planar inclined surface s1 is formed in a partial region of the insulating layer 300, and the concave curved surface s2 is formed in the remaining region of the insulating layer 300 and the entirety of the adhesive layer 200.

However, in all the cases, the planar inclined surface s1 and the concave curved surface s2 have substantially the same instantaneous slope in the portion where the planar inclined surface s1 and the concave curved surface s2 meet, and thus the two surfaces are smoothly connected without bending at the boundary, as described above.

Referring to FIG. 1A again, the cavity C may include a first region C1 passing through the insulating layer 300 and a second region C2 passing through the adhesive layer 200. The inner side surface may be formed steeper in the first region C1 of the cavity C than in the second region C2 of the cavity C. In this case, the sectional line of the cavity C may have a slope changing (decreasing) in a direction from the first region C1 to the second region C2 such that the sectional line becomes approximately horizontal. Here, in the sectional line of the cavity C, a slope variation in the first region C1 may be smaller than a slope variation in the second region C2.

A first outer layer circuit 610 may be formed on an upper surface of the insulating layer 300, and a second outer layer circuit 620 may be formed on the other surface of the insulating material 100 (the other surface c of the second layer 112). The first outer layer circuit 610 may protrude upward from the upper surface of the insulating layer 300, and the second outer layer circuit 620 may protrude downward from the other surface (the other surface of the second layer 112) of the insulating material 100. That is, the first outer layer circuit 610 and the second outer layer circuit 620 may protrude in opposite directions.

Meanwhile, the first outer layer circuit 610 and the second outer layer circuit 620 may be formed of the same material. The first outer layer circuit 610 and the second outer layer circuit 620 may be formed of one or more of copper (Cu), silver (Ag), palladium (Pd), aluminum (Al), nickel (Ni), titanium (Ti), gold (Au), and platinum (Pt). The outer layer circuits (the first outer layer circuit 610 and the second outer layer circuit 620) may be located outside the inner layer circuits (the first inner layer circuit 510 and the second inner layer circuit 520) and may be outermost layer circuits in the PCB.

Meanwhile, the PCB according to the present example may further include a via 400, a solder resist, etc.

The via 400 may pass through both of the insulating layer 300 and the adhesive layer 200 to electrically connect the first outer layer circuit 610 and the first inner layer circuit 510. In particular, the via 400 may be connected to the via pad VP. Since the via 400 passes through both of the insulating layer 300 and the adhesive layer 200, the via 400 has no separate land at the boundary between the insulating layer 300 and the adhesive layer 200. When the via pad VP is located closer to an edge than the bump pad BP, the via 400 may be located closer to the edge than the cavity C, and the via 400 may be disposed along the circumference of the cavity C in the vicinity of the cavity C. Here, the via 400 may be provided with a plurality of vias.

The via 400 may have a cross-sectional area decreasing in a direction toward the via pad VP. In this case, as shown in FIG. 1A, the via 400 has an inverted trapezoid-shaped longitudinal section.

As described above, some of the plurality of inner vias IV may be connected to the via pad VP. Such an inner via IV connected to the via pad VP has a cross-sectional area decreasing in a direction toward the via pad VP. In FIG. 1A, the inner via IV may have a regular trapezoid-shaped longitudinal section. That is, the via 400 and the inner via IV may be symmetrical with respect to the via pad VP. However, even in this case, the via 400 and the inner via IV may have different heights (thicknesses), and the via 400 may have a greater height (thickness) than the inner via IV.

Some of the plurality of inner vias IV may not be connected to the via pad VP, and such an inner via IV not connected to the via pad VP may also have a cross-sectional area decreasing in a direction toward one surface of the insulating material 100. Also, the second outer layer circuit 620 and the second inner layer circuit 520 may be connected to each other through an inner via IV, and the inner via IV for connecting the second outer layer circuit 620 and the second inner layer circuit 520 may have a cross-sectional area decreasing in a direction toward the one surface of the insulating material 100. For example, the via 400 passing through the insulating layer 300 and the adhesive layer 200 and all the inner vias IV formed inside the insulating material 100 may have symmetrical shapes (or opposite shapes).

In order to protect the outer layer circuits, the solder resist may be stacked on the upper surface of the insulating layer 300 or the other surface (the lower surface) of the insulating material 100 (the other surface c of the second layer 112). The solder resist may be formed of a photosensitive material. Also, the solder resist may have the thermosetting property and/or the photo-curing property.

The solder resist may include a first solder resist 810 formed on the upper surface of the insulating layer 300 to protect the first outer layer circuit 610 and a second solder resist 820 formed on the lower surface of the insulating material 100 (the other surface of the second layer 112) to protect the second outer layer circuit 620. Since the first solder resist 810 does not cover the cavity C, the bump pad BP may be exposed in the PCB even when the first solder resist 810 is formed on the insulating layer 300.

Meanwhile, the first solder resist 810 may have a first opening 811 exposing a portion of the first outer layer circuit 610, and the second solder resist 820 may have a second opening 821 exposing a portion of the second outer layer circuit 620. Regions of the outer layer circuits exposed through the openings (the first opening 811 and the second opening 821) may be bonded to an external board.

Figure 2:
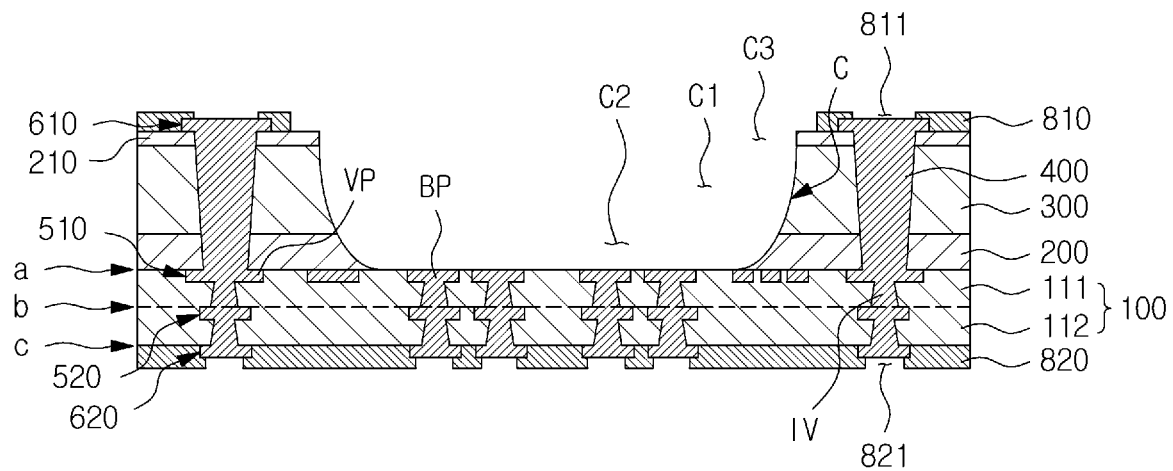
FIG. 2 is a diagram showing a printed circuit board according to one or more other examples.

FIG. 2 is a diagram showing a PCB according to one or more other examples.

Referring to FIG. 2, the PCB according to one or more other examples includes an insulating material 100, an adhesive layer 200, an insulating layer 300, and a cavity C, and further includes a second adhesive layer 210. The insulating material 100, the adhesive layer 200, and the insulating layer 300 are the same as those of the examples that have been described with reference to FIGS. 1A to 1E, and redundant description thereof will be omitted.

The second adhesive layer 210 is a layer stacked on an upper surface of the insulating layer 300 and may be a resin layer composed of a thermosetting resin. The second adhesive layer 210 may be formed of one or more of an epoxy resin, an amino resin, a phenol resin, a urea resin, a melamine resin, an unsaturated polyester resin, and a polyurethane resin. The second adhesive layer 210 may include a prepreg containing glass cloth and/or a build-up film that does not contain glass fibers. The second adhesive layer 210 may have not only the thermosetting property but also the photo-curing property. The second adhesive layer 210 may be formed of the same material as the above-described adhesive layer 200. The second adhesive layer 210 may have a smaller thickness than the adhesive layer 200.

The second adhesive layer 210 and the adhesive layer 200 are formed on both surfaces of the insulating layer 300, and thus it is possible to reduce the warpage of the PCB.

The cavity C has a cross-sectional area decreasing in a direction toward the insulating material 100 (downward). Also, the cavity C may be formed to pass through the second adhesive layer 210 as well as the adhesive layer 200 and the insulating layer 300. That is, the adhesive layer 200, the insulating layer 300, and the second adhesive layer 210 are removed at one time in the process of forming the cavity C, and an inner side surface of the cavity C structurally has a surface that is smoothly connected without bending at a boundary between the adhesive layer 200 and the insulating layer 300 and at a boundary between the insulating layer 300 and the second adhesive layer 210. Also, since the instantaneous slope (or curvature) the sectional line of the cavity C does not substantially change at the boundaries, the section line may have a smooth straight line or curved line.

The inner side surface of the cavity C may include a concave curved surface. Here, the concave curved surface means a curved surface that is recessed into the adhesive layer 200, the insulating layer 300, and the second adhesive layer 210, and the sectional line of the cavity C appearing on the longitudinal section of the cavity C may include a downward curved line. Meanwhile, a portion of the sectional line of the cavity C may be a straight line.

The shapes of the inner side surface of the cavity C in the insulating layer 300 and the adhesive layer 200 may be the same as those described with reference to FIGS. 1A to 1E. The inner side surface of the cavity C in the second adhesive layer 210 may include a planar inclined surface and/or a concave curved surface. That is, the sectional line of the cavity C in the second adhesive layer 210 may include a straight line and/or a curved line. The cavity C may include a first region C1 passing through the insulating layer 300, a second region C2 passing through the adhesive layer 200, and a third region C3 passing through the second adhesive layer 210. The inner side surface may be formed steeper in the first region C1 of the cavity C than in the second region C2 of the cavity C. Also, the inner side surface may be formed steeper in the third region C3 of the cavity C than in the first region C1 of the cavity C. In this case, the sectional line of the cavity C may have a slope changing (decreasing) in a direction from the third region C3 to the first region C1 and then the second region C2 such that the sectional line becomes approximately horizontal. Here, in the sectional line of the cavity C, a slope variation in the first region C1 may be smaller than a slope variation in the second region C2. Also, a slope variation in the third region C3 may be smaller than the slope variation in the first region C1.

The PCB according to the present example may further include a via 400, a solder resist, etc.

The via 400 may be formed to pass through the second adhesive layer 210 as well as the adhesive layer 200 and the insulating layer 300. The via 400 has no land at the boundary between the adhesive layer 200 and the insulating layer 300 and at the boundary between the insulating layer 300 and the second adhesive layer 210. The via 400 may have a cross-sectional area decreasing in a direction from the second adhesive layer 210 to the adhesive layer 200.

In the PCB according to the present example, a first outer layer circuit 610 may be formed on the second adhesive layer 210. This is different from the first outer layer circuit 610 formed on the upper surface of the insulating layer 300 in the PCB according to the examples described with reference to FIGS. 1A to 1E. The above-described via 400 may be understood as passing through all of the adhesive layer 200, the insulating layer 300, and the second adhesive layer 210 to electrically connect the first outer layer circuit 610 and a first inner layer circuit 510.

The other elements may be the same as those described with reference to FIGS. 1A to 1E.

Figure 3:
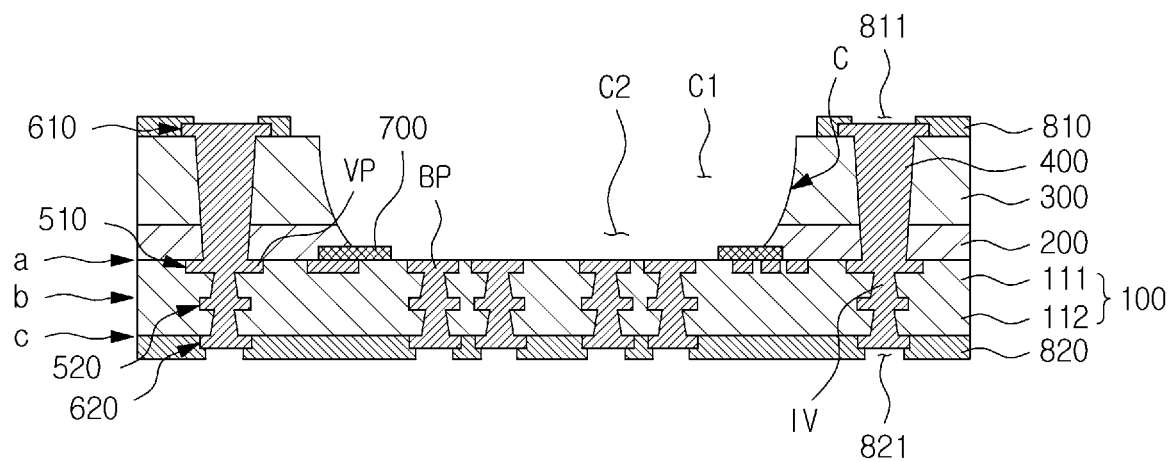
FIG. 3 is a diagram showing a printed circuit board according to one or more still other examples.

FIG. 3 is a diagram showing a PCB according to one or more still other examples.

Referring to FIG. 3, the PCB according to one or more still other examples includes an insulating material 100, an adhesive layer 200, an insulating layer 300, and a cavity C, and further includes a protective layer 700. The insulating material 100, the adhesive layer 200, the insulating layer 300, and the cavity C are the same as those of the examples that has been described with reference to FIGS. 1A to 1E, and redundant description thereof will be omitted.

The protective layer 700 is formed on the one surface of the insulating material 100 and formed around the circumference of the cavity C. The protective layer 700 may protect the first inner layer circuit 510. In particular, the protective layer 700 can prevent damage to the first inner layer circuit 510 located around the circumference of the cavity C in a bottom surface of the cavity C when the cavity C is processed. When the cavity C is processed through sandblasting, damage to the first inner layer circuit 510 located around the circumference of the cavity C may occur, and this damage may be prevented by the protective layer 700. Here, the protective layer 700 may have a higher toughness than the adhesive layer 200. Accordingly, when the sandblasting is performed, the protective layer 700 may be hardly processed by abrasive materials used in the sandblasting.

The protective layer 700 may be continuously formed around the circumference of the cavity C and may be ring-shaped.

The protective layer 700 may have an edge covered by the adhesive layer 200. That is, the protective layer 700 may be stacked on the one surface of the insulating material 100, and then the adhesive layer 200 may be stacked on the one surface of the insulating material 100 to cover the protective layer 700. The cavity C may be formed in a region narrower than an outer periphery of the protective layer 700.

The protective layer 700 may be formed of the same material as the above-described solder resist.

The other elements may be the same as those described with reference to FIGS. 1A to 1E.

Figure 4A:
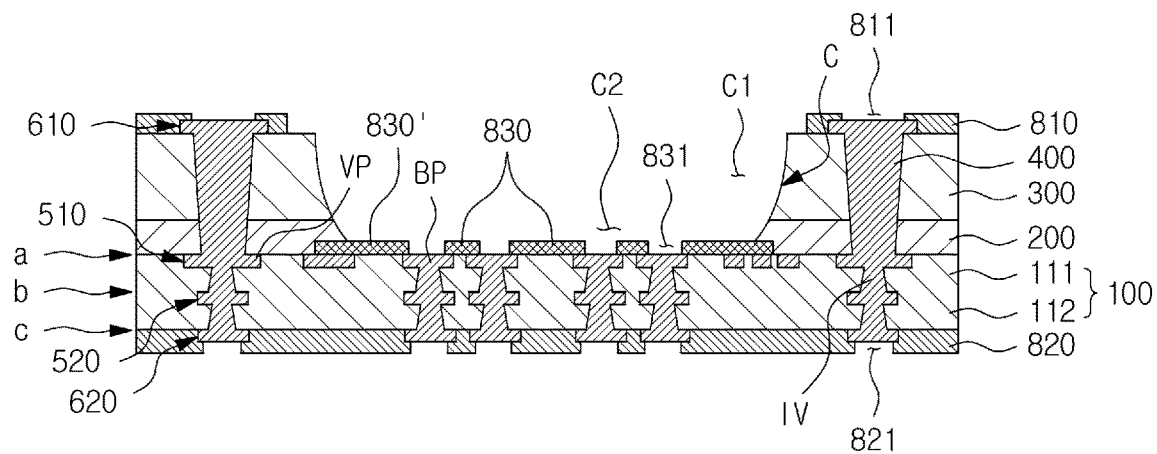
FIGS. 4A to 4C are diagrams showing a printed circuit board according to one or more still other examples.
Figure 4B:
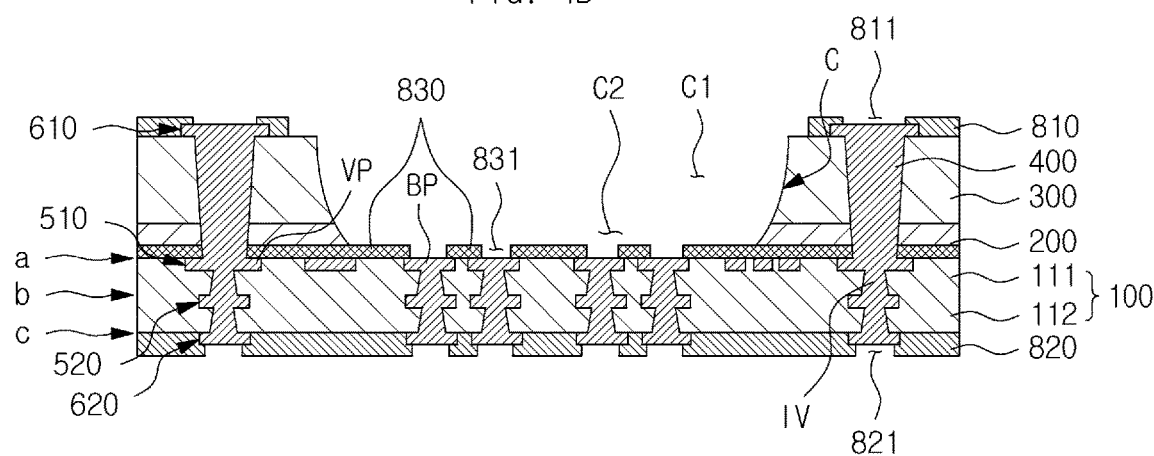
Figure 4C:
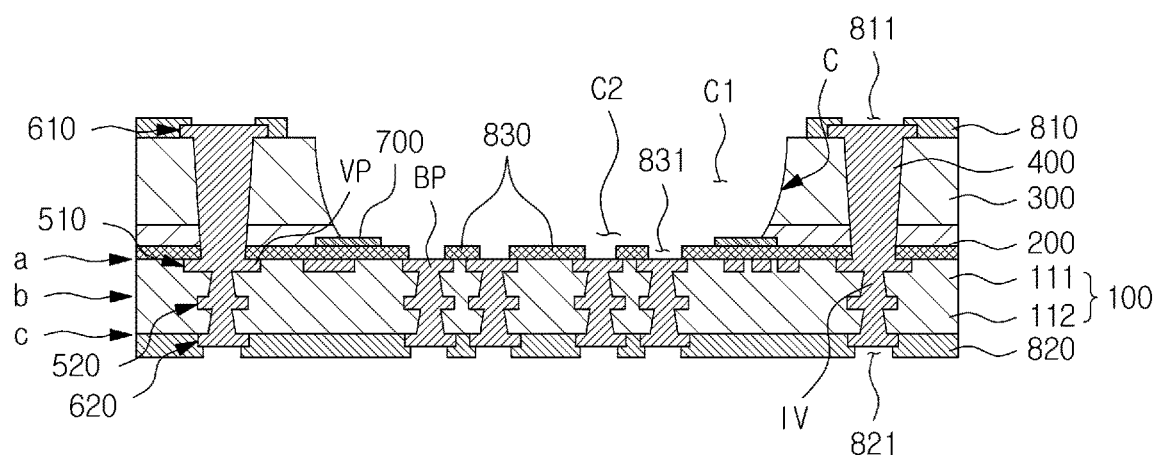

FIGS. 4A to 4C are diagrams showing a PCB according to one or more still other examples.

Referring to FIG. 4A, the PCB according to an example includes an insulating material 100, an adhesive layer 200, an insulating layer 300, and a cavity C, and further includes a solder resist. The insulating material 100, the adhesive layer 200, the insulating layer 300, and the cavity C are the same as those of the example that have been described with reference to FIGS. 1A to 1E, and redundant description thereof will be omitted.

The solder resist may include a first solder resist 810 formed on an upper surface of the insulating layer 300 to protect a first outer layer circuit 610, a second solder resist 820 formed on a lower surface of the insulating material 100 (the other surface of the second layer 112) to protect a second outer layer circuit 620, and a third solder resist 830 formed on the one surface of the insulating material 100 to protect a first inner layer circuit 510. A portion of the third solder resist 830 is located inside the cavity C.

The first solder resist 810 may have a first opening 811 exposing a portion of the first outer layer circuit 610, and the second solder resist 820 may have a second opening 821 exposing a portion of the second outer layer circuit 620. Also, the third solder resist 830 has a third opening 831 exposing a bump pad BP. The third opening 831 may have a smaller width than the bump pad BP.

Since the first solder resist 810 does not cover the cavity C and the third solder resist 830 has the third opening 831, the bump pad BP may be exposed in the PCB.

The first solder resist 810 to the third solder resist 830 may be formed of a photosensitive material. Also, the solder resist may have the thermosetting property and/or the photocuring property. The first solder resist 810 to the third solder resist 830 may be formed of the same material. Meanwhile, two or more of the first solder resist 810 to the third solder resist 830 may be formed of different materials.

For example, the third solder resist 830 may be formed of a material with a higher toughness than the adhesive layer 200, and the third solder resist 830 may be formed of a material with a higher toughness than the first solder resist 810 and/or the second solder resist 820.

The third solder resist 830 may be stacked on the one surface of the insulating material 100 before the adhesive layer 200. Here, the third solder resist 830 may be formed not on the entirety of the one surface of the insulating material 100 but to correspond to a region where the cavity is to be formed. For example, after the third solder resist 830 is formed on the entirety of the one surface of the insulating material 100, the third solder resist 830 may be patterned to remain corresponding to the region where the cavity C is to be formed.

When the adhesive layer 200 and the insulating layer 300 are stacked on the one surface of the insulating material 100 and then the cavity C is processed, the cavity C may be formed narrower than the remaining region of the third solder resist 830. The third solder resist 830 may protect the first inner layer circuit 510 while the cavity C is processed. When the cavity C is processed through sandblasting, the third solder resist 830 may not be damaged by abrasive materials used in the sandblasting. For example, a portion 830' of the third solder resist 830 may perform the same function as the above-described protective layer 700. The portion 830' of the third solder resist 830 may be continuously formed along the circumference of the cavity C and may be ring-shaped. Also, the portion 830' of the third solder resist 830 may have an edge covered by the adhesive layer 200.

Meanwhile, after the cavity C is processed, the third opening 831 may be formed in the third solder resist 830.

FIG. 4B is a modification of FIG. 4A. Referring to FIG. 4B, the third solder resist 830 is formed on almost the entirety of the one surface (a) of the insulating material 100, including the bottom surface of the cavity C, and the adhesive layer 200 is formed on the third solder resist 830. That is, the third solder resist 830 is interposed between the adhesive layer 200 and the insulating material 100. In this case, the via 400 passes through all of the adhesive layer 200, the insulating layer 300, and the third solder resist 830.

FIG. 4C is a modification of FIG. 4B. Referring to FIG. 4C, the protective layer 700 is formed on the third solder resist 830. The protective layer 700 may be continuously formed around the circumference of the cavity C, and a portion of the edge of the protective layer 700 may be covered by the adhesive layer 200. The protective layer 700 may be formed of the same material as or a different material from the third solder resist 830.

Figure 9:
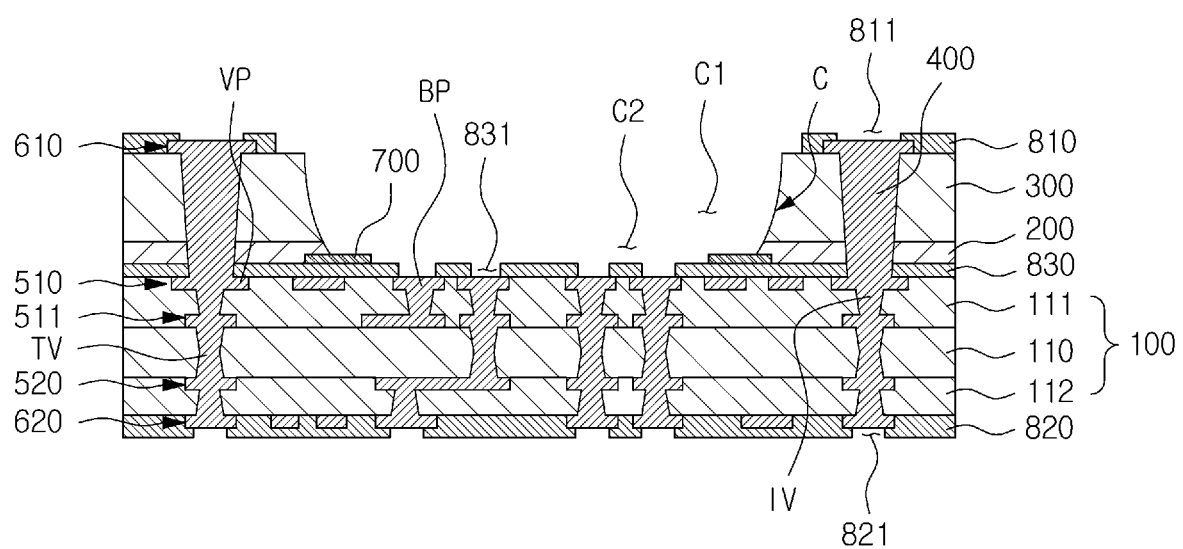
FIG. 9 is a diagram showing a printed circuit board according to one or more still other examples.

FIG. 9 is a diagram showing a PCB according to one or more still other examples.

Referring to FIG. 9, the PCB according to one or more still other examples may include an insulating material 100, an adhesive layer 200, an insulating layer 300, and a cavity C. Comparing these one or more examples to the examples referring to FIGS. 1A to 1E, there is a difference in the configuration of the insulating material 100. Also, only main features of these examples will be described below, and redundant description will be omitted.

In the present examples, the insulating material 100 may include a core layer 110, a first layer 111, and a second layer 112. The core layer 110 may contain a resin such as an epoxy resin, a PI resin, a BT resin, and an LCP. For example, a PPG or an ABF film may be used as the core layer 110. The first layer 111 is formed on one surface (an upper surface) of the core layer 110, and the second layer 112 is formed on the other surface (a lower surface) of the core layer 110. The first layer 111 and the second layer 112 may be the same as those described with reference to FIG. 1A.

An additional inner layer circuit 511 may be further included as an inner layer circuit. The additional inner layer circuit 511 may be formed on the one surface of the core layer 110 and may be electrically connected to a first inner layer circuit 510 through an inner via IV. Also, the additional inner layer circuit 511 may be electrically connected to a second inner layer circuit 520 by a through via TV. The through via TV passes through the core layer 110, and the through via TV may have a cross-sectional area decreasing in a direction toward the center of the through via TV, but the present examples are not limited thereto.

Figure 5:
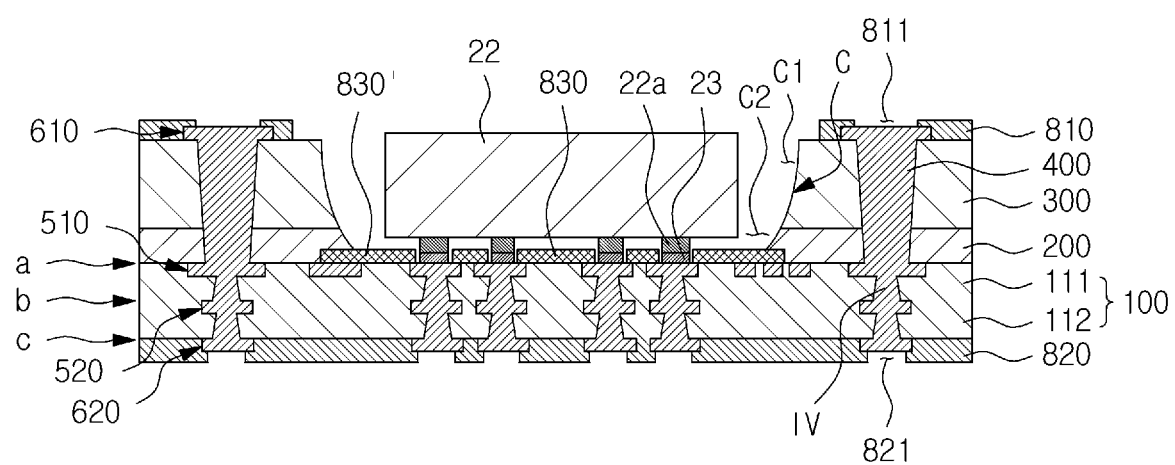
FIG. 5 is a diagram showing one or more examples of a package using the printed circuit board shown in FIG. 4A.

FIG. 5 is a diagram showing one or more examples of a package using the PCB shown in FIG. 4A.

Referring to FIG. 5, the package is implemented by mounting an electronic element 22 on the PCB. Here, the package, which will be described with reference to FIG. 5, may be a lower package in a package-on-package (POP) structure.

The electronic element 22 is located in the cavity C. The electronic element 22 may protrude from the upper surface of the cavity C. That is, the electronic element 22 may have a greater thickness than the depth of the cavity C. However, the present examples are not limited thereto, and the electronic element 22 may not protrude from the cavity C.

An electrode 22a may be provided on one surface of the electronic element 22, and may be formed to protrude toward a bump pad BP. The electrodes 22a of the electronic element 22 may be formed in the same number as bump pads BP. The electrode 22a of the electronic element 22 may be bonded to the bump pad BP. The electrode 22a of the electronic element 22 may be bonded to the bump pad BP using a bonding member 23 such as a solder. That is, the bonding member 23 such as a solder is located on a bump pad BP in the third opening 831, and the electrode 22a of the electronic element 22 is located on the bonding member 23. The cavity C is formed in the PCB. Therefore, when the package and another package are vertically stacked, a distance between the two packages need not be greater than the thickness of the electronic element 22 even when the thickness of the electronic element 22 is large. Meanwhile, the electronic element 22 may be one or more of an active element, a passive element, and an integrated circuit.

Although the PCB described with reference to FIG. 4A has been taken as an example in order to describe the package using the PCB, the other PCBs described with reference to FIGS. 1A to 3, 4B, 4C, and 9 may be used to implement the package. That is, in all the PCBs described with reference to FIGS. 1A to 4C and 9, the package may be provided by the electronic element 22 being inserted into the cavity C and the electrode 22a of the electronic element 22 being bonded to the bump pad BP.

FIGS. 6A to 6E are diagrams showing a method of manufacturing the PCB according to one or more examples.

Figure 6A:
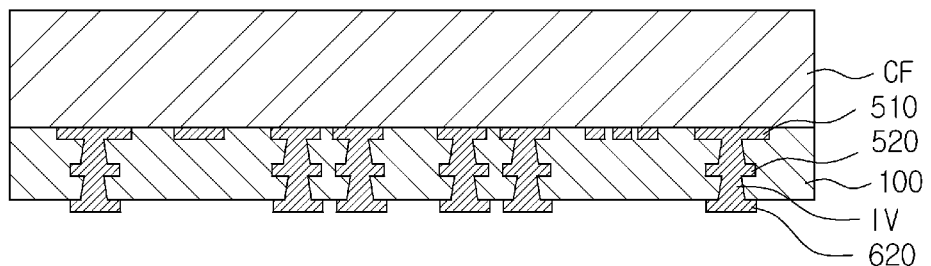
FIGS. 6A to 6E are diagrams showing a method of manufacturing the printed circuit board according to one or more examples.
Figure 6B:
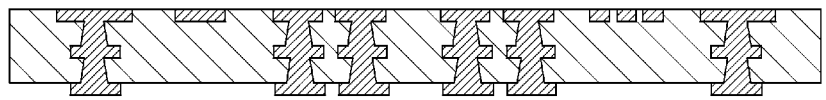

Referring to FIGS. 6A and 6B, an insulating material 100 having a first inner layer circuit 510, a second inner layer circuit 520, a second outer layer circuit 620, and an inner via IV is formed using a carrier film CF. For example, the insulating material 100 may be formed by forming the first inner layer circuit 510 on the carrier film CF, stacking a first layer 111, forming an inner via IV and the second inner layer circuit 520, stacking a second layer 112, forming an inner via IV and the second outer layer circuit 620, and then removing the carrier film CF. Meanwhile, since the carrier film CF is used, the first inner layer circuit 510 may be buried in one surface of the first layer 111.

Figure 6C:
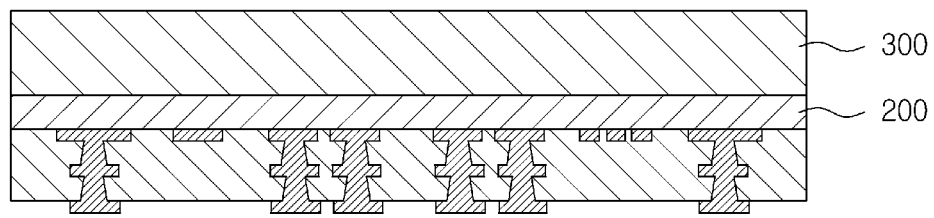

Referring to FIG. 6C, an adhesive layer 200 and an insulating layer 300 are sequentially stacked on one surface of the insulating material 100.

Figure 6D:
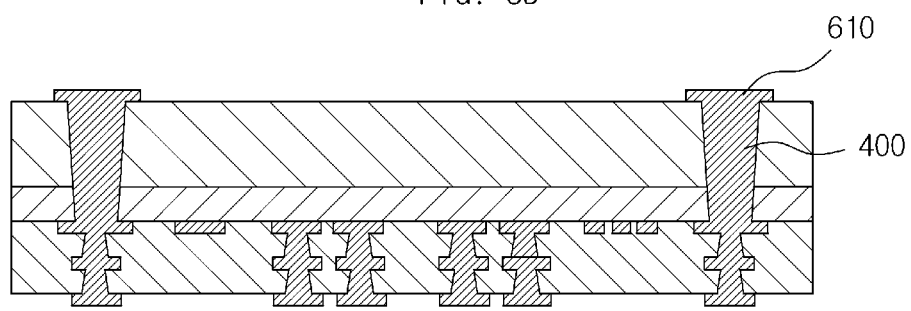

Referring to FIG. 6D, a via 400 and a first outer layer circuit 610 are formed.

Figure 6E:
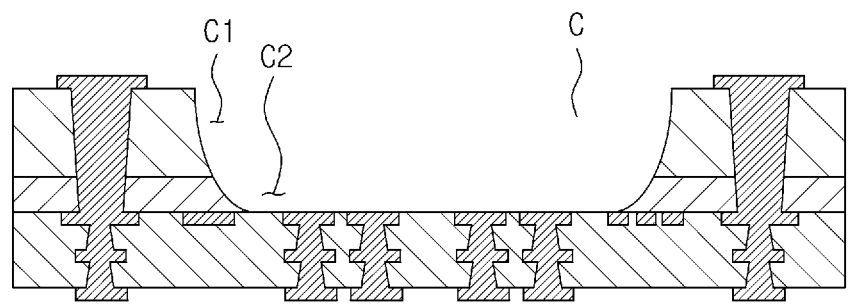

Referring to FIG. 6E, a cavity C is formed. The cavity C may be formed through sandblasting. Sandblasting is the operation of projecting abrasive materials such as alumina onto a sample to remove the sample. The adhesive layer 200 and the insulating layer 300 may be removed at one time through the sandblasting. Also, through the sandblasting, the cavity C may have an inner side surface including a concave curved surface, and the inner side surface of the cavity C may be formed steeper in the insulating layer 300 than in the adhesive layer 200.

Meanwhile, FIGS. 6A to 6E show a method of manufacturing the PCB described with reference to FIG. 1A, but the PCBs described with reference to FIGS. 1B to 4C and 9 may be manufactured in a similar method.

However, in a method of manufacturing the PCB described with reference to FIG. 2, a process of forming a second adhesive layer 210 on the insulating layer 300 is additionally included. The first outer layer circuit 610 is formed on the second adhesive layer 210. The via 400 is formed to pass through all of the adhesive layer 200, the insulating layer 300, and the second adhesive layer 210, and the cavity C is also formed to pass through all of the adhesive layer 200, the insulating layer 300, and the second adhesive layer 210.

In a method of manufacturing the PCB described with reference to FIG. 3, a protective layer 700 is stacked on one surface of the insulating material 100 before the adhesive layer 200 and the insulating layer 300 are stacked on one surface of the insulating material 100. When the adhesive layer 200 and the insulating layer 300 are stacked, the adhesive layer 200 covers the protective layer 700. The cavity C may be formed in a region narrower than an outer periphery of the protective layer 700, and a portion of the protective layer 700 may be exposed through the cavity C. Also, in this case, even after the cavity C is formed, a portion of the protective layer 700 may be covered by the adhesive layer 200.

In a method of manufacturing the PCB described with reference to FIG. 4A, a third solder resist 830 is stacked on one surface of the insulating material 100 before the adhesive layer 200 and the insulating layer 300 are stacked on one surface of the insulating material 100. The third solder resist 830 covers the bump pad BP. When the adhesive layer 200 and the insulating layer 300 are stacked, the adhesive layer 200 covers the third solder resist 830. The cavity C may be formed in a region narrower than an outer periphery of the third solder resist 830, and a portion of the third solder resist 830 is exposed through the cavity C. Also, a third opening 831 is formed in the exposed third solder resist 830 to expose the bump pad BP. Also, in this case, even after the cavity C is formed, a portion of the third solder resist 830 may be covered by the adhesive layer 200.

In a method of manufacturing the PCB described with reference to FIG. 9, an insulating material having a first inner layer circuit 510, an additional inner layer circuit 511, a second inner layer circuit 520, a second outer layer circuit 620, a through via TV, and an inner via IV may be formed using a carrier film CF as described with reference to FIGS. 6A and 6B. For example, the insulating material 100 may be formed by forming the first inner layer circuit 510 on the carrier film CF, stacking a first layer 111, forming an inner via IV and the additional inner layer circuit 511, stacking a core layer 110, forming a through via TV and the second inner layer circuit 520, stacking a second layer 112, forming an inner via IV and the second outer layer circuit 620, and then removing the carrier film CF. Meanwhile, since the carrier film CF is used, the first inner layer circuit 510 may be buried in one surface of the first layer 111.

Figure 7:
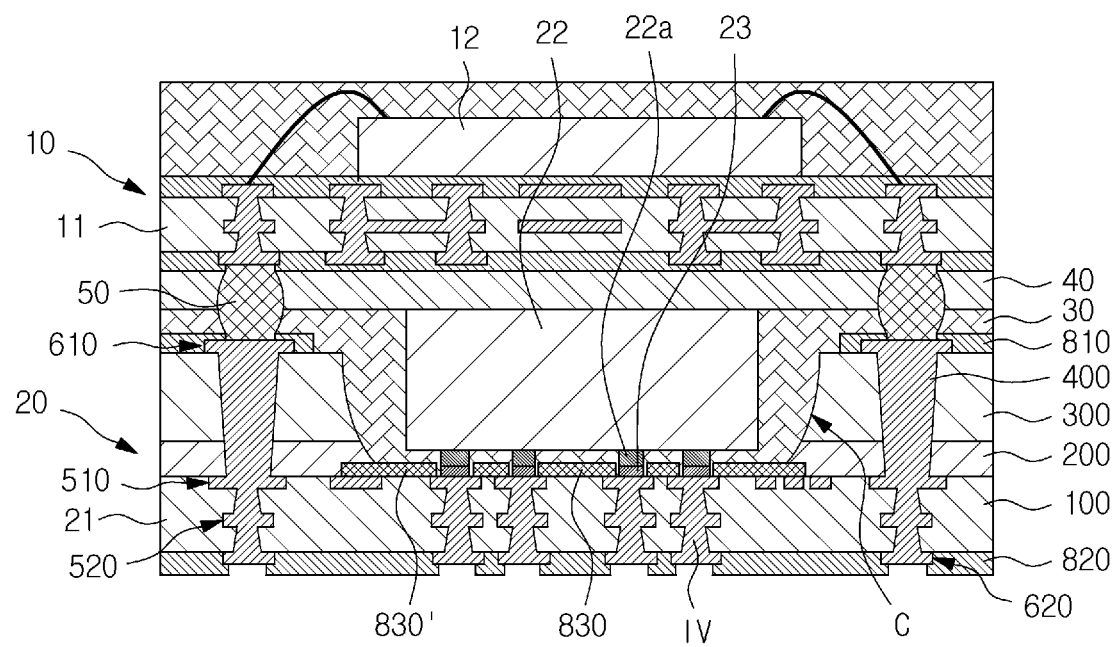
FIG. 7 is a diagram showing a package structure according to one or more examples.

FIG. 7 is a diagram showing a package structure according to one or more examples.

Referring to FIG. 7, the package structure according to one or more examples includes an upper package 10 and a lower package 20. The upper package 10 includes a PCB 11 with an electronic element 12 mounted thereon. The PCB 11 of the upper package 10 may not include a cavity. In this case, the electronic element 12 may be mounted on an upper surface of the PCB 11. The electronic element 12 may be mounted through wire bonding, but the present examples are not limited thereto. The electronic element 12 may be mounted through flip-chip bonding.

In the present examples, the package described with reference to FIG. 5 may be utilized as the lower package 20.

The lower package 20 includes a PCB 21 with an electronic element 22 mounted thereon, and the PCBs according to the aforementioned various examples may be utilized as the PCB 21 according to the present example.

The electronic element 22 is located in the cavity C. An electrode 22a may be provided on one surface of the electronic element 22, and may be formed to protrude toward a bump pad BP. The electrodes 22a of the electronic element 22 may be formed in the same number as the bump pads BP. The electrode 22a of the electronic element 22 may be bonded to the bump pad BP. The electrode 22a of the electronic element 22 may be bonded to the bump pad BP using a bonding member 23 such as a solder.

When the PCB 21 includes the third solder resist 830, the bonding member 23 such as a solder is located on the bump pad BP in the third opening 831, and the electrode 22a of the electronic element 22 is located on the bonding member 23.

The electronic element 22 may be one or more of an active element, a passive element, and an integrated circuit.

A first molding material 30 may be formed in the cavity C into which the electronic element 22 is inserted. The first molding material 30 may fix the electronic element 22 in the cavity C. The first molding material 30 may be formed up to an upper side of the lower package 20. For example, when the electronic element 22 protrudes from the upper surface of the cavity C, the first molding material 30 may be formed up to the height of the upper surface (the other surface) of the electronic element 22. The upper package 10 may be located at an upper side of the first molding material 30.

A second molding material 40 may be interposed between the first molding material 30 and the upper package 10. The second molding material 40 is filled in a gap between the two packages caused by the thickness of a conductive member 50, which will be described below. When the electronic element 22 protrudes from the upper surface of the cavity C and the first molding material 30 is formed up to the height of the upper surface (the other surface) of the electronic element 22, the second molding material 40 may be brought into contact with the upper surface (the other surface) of the electronic element 22. Meanwhile, the second molding material 40 may be omitted if necessary.

Meanwhile, the electronic element 12 mounted on the PCB 11 may also be molded in the upper package 10.

The upper package 10 and the lower package 20 may be bonded to each other using the conductive member 50 such as a solder ball. The conductive member 50 may be located on the via 400 and bonded to a region exposed through the first opening 811 of the first solder resist 810 in the first outer layer circuit 610. The conductive member 50 may pass through the first molding material 30 and the second molding material 40. When the via 400 is located closer to an edge than the cavity C, the conductive member 50 may also be located at an edge of the lower package 20.

In the package structure according to the present example, the cavity C is formed in the PCB of the lower package 20, and the electronic element 22 is mounted in the cavity C. Therefore, a distance between the lower package 20 and the upper package 10 need not be greater than the thickness of the electronic element 22, and the two packages can implement a POP structure without a separate interposer even when the conductive member 50 bonding the two packages has a small pitch.

An example procedure of manufacturing the package structure is as follows.

The upper package 10 and the lower package 20 are prepared. For example, in the lower package 20, the PCB with the cavity C is formed, the electronic element 22 is located in the cavity C, and the electronic element 22 is bonded to the bump pad BP. The first molding material 30 flowed into the cavity C is formed, and the conductive member 50 bonded to the first outer layer circuit 610 on the via 400 through the first molding material 30 is formed. For example, a hole is formed in the first molding material 30, and the conductive member 50 is located in the hole. The upper package 10 is bonded onto the conductive member 50, and the second molding material 40 is formed between the upper package 10 and the lower package 20.

Figure 8:
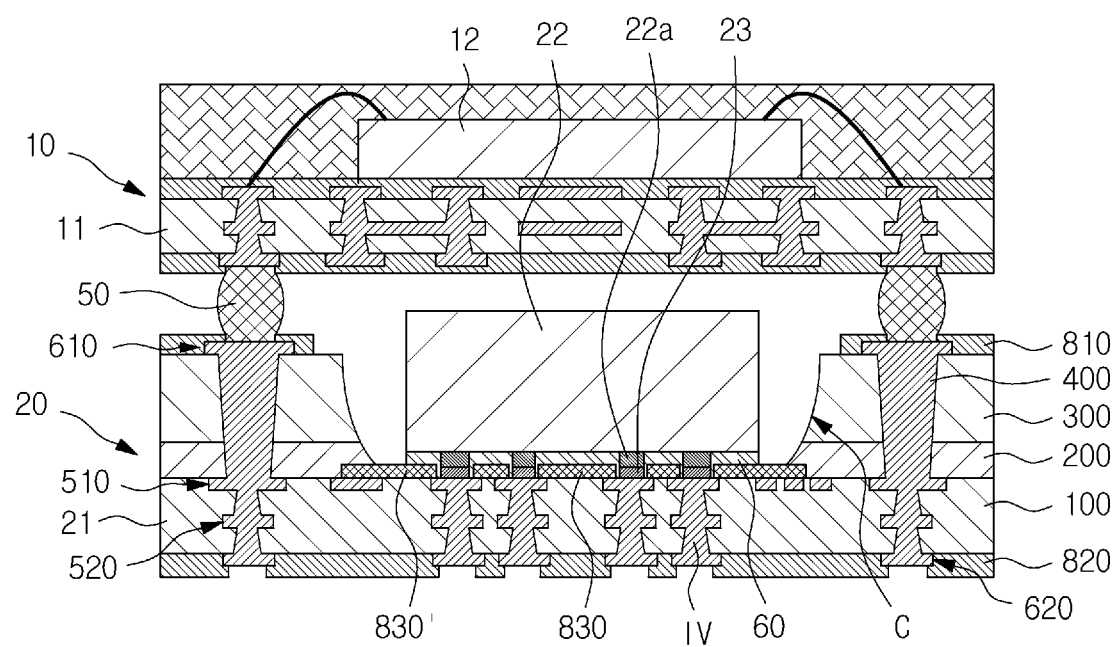
FIG. 8 is a diagram showing a package structure according to one or more other examples.

FIG. 8 is a diagram showing a package structure according to one or more other examples.

Comparing the package structure to be described with reference to FIG. 8 to the package structure described with reference to FIG. 7, an underfill 60 is additionally included.

The underfill 60 is a material filling a gap between the electronic element 22 and the insulating material 100 after the electronic element 22 is mounted in the cavity C of the PCB 21 in the lower package 20 and may fix the electronic element 22 in the cavity C. In particular, when the electrode 22a of the electronic element 22 protrudes and thus a gap occurs between the one surface of the electronic element 22 and the insulating material 100, the underfill 60 is filled in the gap.

Since the electronic element 22 is fixed by the underfill 60, the above-described first molding material 30 may be omitted, and also the second molding material 40 may be omitted. However, unlike FIG. 8, a single layer of molding material may be interposed between the two packages.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A printed circuit board comprising:
an insulating material comprising a bump pad buried in one surface;
an adhesive layer stacked on the one surface of the insulating material;
an insulating layer stacked on the adhesive layer;
a cavity passing through both of the adhesive layer and the insulating layer to expose the bump pad,
wherein the cavity is configured to accommodate an electronic element such that a distance between the one surface of the insulating material and a top of the electronic component is less than a sum of thicknesses of the adhesive layer, the insulating layer, and the electronic element, and wherein the cavity comprises a cross-sectional area decreasing in a direction toward the insulating material in both the adhesive layer and the insulating layer.

2. The printed circuit board of claim 1, further comprising a solder resist disposed on a bottom surface of the cavity to expose the bump pad.

3. The printed circuit board of claim 1, further comprising a second adhesive layer disposed on the insulating layer.

4. The printed circuit board of claim 1, wherein the insulating layer comprises a greater thickness than the adhesive layer.

5. The printed circuit board of claim 1, further comprising a protective layer disposed on the one surface of the insulating material along a circumference of the cavity.

6. The printed circuit board of claim 5, wherein the protective layer comprises an edge covered by the adhesive layer.

7. The printed circuit board of claim 1, wherein the cavity comprises an inner side surface comprising a concave curved surface.

8. The printed circuit board of claim 7, wherein the cavity comprises a first region passing through the insulating layer and a second region passing through the adhesive layer, and wherein the inner side surface of the first region is steeper than the inner side surface of the second region.

9. The printed circuit board of claim 1, further comprising a via passing through both of the insulating layer and the adhesive layer.

10. The printed circuit board of claim 9, further comprising a via pad buried in the one surface of the insulating material, wherein the via is connected to the via pad.

11. The printed circuit board of claim 10, further comprising an inner via disposed inside the insulating material connected to the via pad, wherein the via comprises a cross-sectional area decreasing in a direction toward the via pad, and wherein the inner via comprises a cross-sectional area decreasing in a direction toward the via pad.

12. A package structure in which an upper package and a lower package are bonded, the lower package comprising a printed circuit board with an electronic element mounted thereon, wherein the printed circuit board comprises:

an insulating material comprising a bump pad buried in one surface;

an adhesive layer stacked on the one surface of the insulating material;

an insulating layer stacked on the adhesive layer;

a cavity passing through both of the adhesive layer and the insulating layer to expose the bump pad wherein the cavity comprises a cross-sectional area decreasing in a direction toward the insulating material in both the adhesive layer and the insulating layer, and wherein the electronic element is located inside the cavity and bonded to the bump pad such that a distance between the one surface of the insulating material and a top of the electronic component is less than a sum of thicknesses of the adhesive layer, the insulating layer, and the electronic element.

13. The package structure of claim 12, wherein the printed circuit board further comprises a solder resist disposed on a bottom surface of the cavity to expose the bump pad.

14. The package structure of claim 12, wherein the printed circuit board further comprises a second adhesive layer disposed on the insulating layer.

15. The package structure of claim 12, wherein the insulating layer comprises a greater thickness than the adhesive layer.

16. The package structure of claim 12, wherein the printed circuit board further comprises a protective layer disposed on the one surface of the insulating material along a circumference of the cavity.

17. The package structure of claim 16, wherein the protective layer comprises an edge covered by the adhesive layer.

18. The package structure of claim 12, wherein the cavity comprises an inner side surface comprising a concave curved surface.

19. The package structure of claim 18, wherein the cavity comprises a first region passing through the insulating layer and a second region passing through the adhesive layer, and wherein the inner side surface of the first region is steeper than the inner side surface of the second region.

20. The package structure of claim 12, wherein the printed circuit board further comprises a via passing through both of the insulating layer and the adhesive layer, and wherein the via is electrically connected to the upper package.

21. The package structure of claim 20, wherein the printed circuit board further comprises a via pad buried in the one surface of the insulating material, and wherein the via is connected to the via pad.

22. The package structure of claim 21, wherein the printed circuit board further comprises an inner via disposed inside the insulating material connected to the via pad, wherein the via comprises a cross-sectional area decreasing in a direction toward the via pad, and wherein the inner via comprises a cross-sectional area decreasing in a direction toward the via pad.

* * * * *